US009449675B2

(12) United States Patent
Wheeler

(10) Patent No.: US 9,449,675 B2
(45) Date of Patent: Sep. 20, 2016

(54) APPARATUSES AND METHODS FOR IDENTIFYING AN EXTREMUM VALUE STORED IN AN ARRAY OF MEMORY CELLS

(71) Applicant: Micron Technology, Inc., Boise, ID (US)

(72) Inventor: Kyle B. Wheeler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 14/068,973

(22) Filed: Oct. 31, 2013

(65) Prior Publication Data
US 2015/0120987 A1    Apr. 30, 2015

(51) Int. Cl.
*G11C 11/4091* (2006.01)
*G11C 11/4094* (2006.01)
*G11C 7/06* (2006.01)
*G11C 7/10* (2006.01)
*G11C 11/406* (2006.01)
*G11C 7/12* (2006.01)

(52) U.S. Cl.
CPC ......... *G11C 11/4094* (2013.01); *G11C 7/1006* (2013.01); *G11C 7/12* (2013.01); *G11C 11/40622* (2013.01); *G11C 7/065* (2013.01); *G11C 11/4091* (2013.01)

(58) Field of Classification Search
CPC . G11C 7/065; G11C 7/1006; G11C 11/4091; G11C 11/4094
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |

(Continued)

FOREIGN PATENT DOCUMENTS

| CN | 102141905 | 8/2011 |
| EP | 0214718 | 3/1987 |

(Continued)

OTHER PUBLICATIONS

International Search and Written Opinion for related PCT Patent Application No. PCT/US2014/059458, dated Jan. 14, 2015, 15 pages.

(Continued)

*Primary Examiner* — Ryan Bertram
(74) *Attorney, Agent, or Firm* — Brooks, Cameron & Huebsch, PLLC

(57) ABSTRACT

The present disclosure includes apparatuses and methods related to identifying an extremum value using sensing circuitry. An example method can include determining a location of an extremum value of a set of N data values stored as vectors in a memory array. A number of operations to determine the location of the extremum value can remain constant with respect to a value of N.
The method can include determining the value of the extremum by reading memory cells coupled to the sense line based on the determined location of the extremum value.

58 Claims, 4 Drawing Sheets

(56) References Cited

U.S. PATENT DOCUMENTS

| | | |
|---|---|---|
| 5,210,850 A | 5/1993 | Kelly et al. |
| 5,253,308 A | 10/1993 | Johnson |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A * | 11/1999 | Alidina ............... G06F 7/544 708/207 |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 * | 9/2005 | Roth ................... G06F 7/22 708/207 |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 * | 11/2008 | Beaumont ............ G06F 9/3001 708/207 |
| 7,454,451 B2 * | 11/2008 | Beaumont ............ G06F 9/3001 708/207 |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 * | 8/2009 | Beaumont ............... G06F 17/10 708/207 |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 * | 4/2013 | Gonion ................ G06F 8/4441 712/222 |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 * | 10/2013 | Gonion ................ G06F 8/4441 712/222 |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 * | 2/2014 | Stortz .................... G06F 7/02 708/207 |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |

(56) References Cited

U.S. PATENT DOCUMENTS

| | | | |
|---|---|---|---|
| 9,165,023 B2* | 10/2015 | Moskovich | G06F 17/30336 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib et al. | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134225 A1 | 5/2012 | Chow | |
| 2012/0134226 A1 | 5/2012 | Chow | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0134713 A1 | 5/2015 | Wheeler | |
| 2015/0324290 A1 | 11/2015 | Leidel | |
| 2015/0325272 A1 | 11/2015 | Murphy | |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 0165359 | 9/2001 |
| WO | 2010079451 | 7/2010 |
| WO | 2013062596 | 5/2013 |
| WO | 2013062596 A1 | 5/2013 |
| WO | 2013081588 | 6/2013 |
| WO | 2013095592 | 6/2013 |

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al, "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http//www.cs.cmu.edu/~damon2006/pdf/adibi06inmemory.pdf.

Office Action for related Taiwan Patent Application No. 103136908, dated Dec. 22, 2015, 24 pages.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al, "On the General Applicability of Instruction-Set Randomization", Jul.-Sep. 2010, (14 pgs.), vol. 7, Issue 3, IEEE Transactions on Dependable and Secure Computing.

Dybdahl, et al, "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

(56) References Cited

OTHER PUBLICATIONS

Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, mailed Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Elliot, et al., "Computational RAM: Implementing Processors in Memory", Jan.-Mar. 1999, (10 pgs.), vol. 16, Issue 1, IEEE Design and Test of Computers Magazine.

\* cited by examiner

APPARATUSES AND METHODS FOR IDENTIFYING AN EXTREMUM VALUE STORED IN AN ARRAY OF MEMORY CELLS

TECHNICAL FIELD

The present disclosure relates generally to semiconductor memory and methods, and more particularly, to apparatuses and methods related to identifying an extremum value stored in an array of memory cells.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block (referred to herein as functional unit circuitry (FUC)), for example, which can be used to execute instructions by performing logical operations such as AND, OR, NOT, NAND, NOR, and XOR logical operations on data (e.g., one or more operands). For example, the FUC may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

Executing instructions (e.g., as part of program execution) can involve performing operations such as compare operations and the results can be provided (e.g., reported) to the processing resources as part of the executional flow of an algorithm, for example. Compare operations can include identifying an extremum value (e.g., a maximum and/or minimum value) of a set of N data values. The number of compare operations can be O(N) operations due to the comparison of each element to at least one other value to determine which one is greater and/or lesser.

DETAILED DESCRIPTION

The present disclosure includes apparatuses and methods related to identifying an extremum (e.g., a maximum or minimum) value stored in an array of memory cells. An example method can include determining a location of an extremum value of a set of N data values stored as vectors (e.g., bit vectors) in a memory array. The determination of the location of the extremum value can include a number of operations that remain constant with respect to a value of N. For example, the number of operations used to determine the extremum value can be the same for ten data values stored as vectors in a memory array as the number of operations used to determine the extremum value for one hundred data values stored as vectors in the memory array. The method can include determining the value of the extremum by reading memory cells coupled to a sense line that store the extremum value.

A number of embodiments of the present disclosure can provide benefits such as determining a location of an extremum value (e.g., a maximum value and/or a minimum value) and determining the value of the extremum. For instance, a number of embodiments can provide for determining which sense line in a memory array is coupled to memory cells that store an extremum value, where each sense line is coupled to a respective plurality of memory cells that store a bit vector that represents a base ten (10) numerical value. An access line coupled to memory cells that store most-significant data (e.g., bit data) refers to the access line that is coupled to the memory cells that store data values for the highest index of the bit vectors. For example, the bit vector 01 can represent a numerical base ten (10) value of "1" while the bit vector 11 can represent a numerical base ten (10) value of 3. In both cases (i.e., the bit vectors 01 and 11), a binary data value of "1" is stored in the memory cells corresponding to the highest index of the bit vectors. In locating an extremum value (e.g., a maximum value), the highest index access line coupled to a memory cell storing a target data value can be determined. Such an identification of a maximum and/or minimum value can be associated with performing a number of logical operations (e.g., AND, NOT, NOR, NAND, XOR, etc.). However, embodiments are not limited to these examples.

Figure 2:
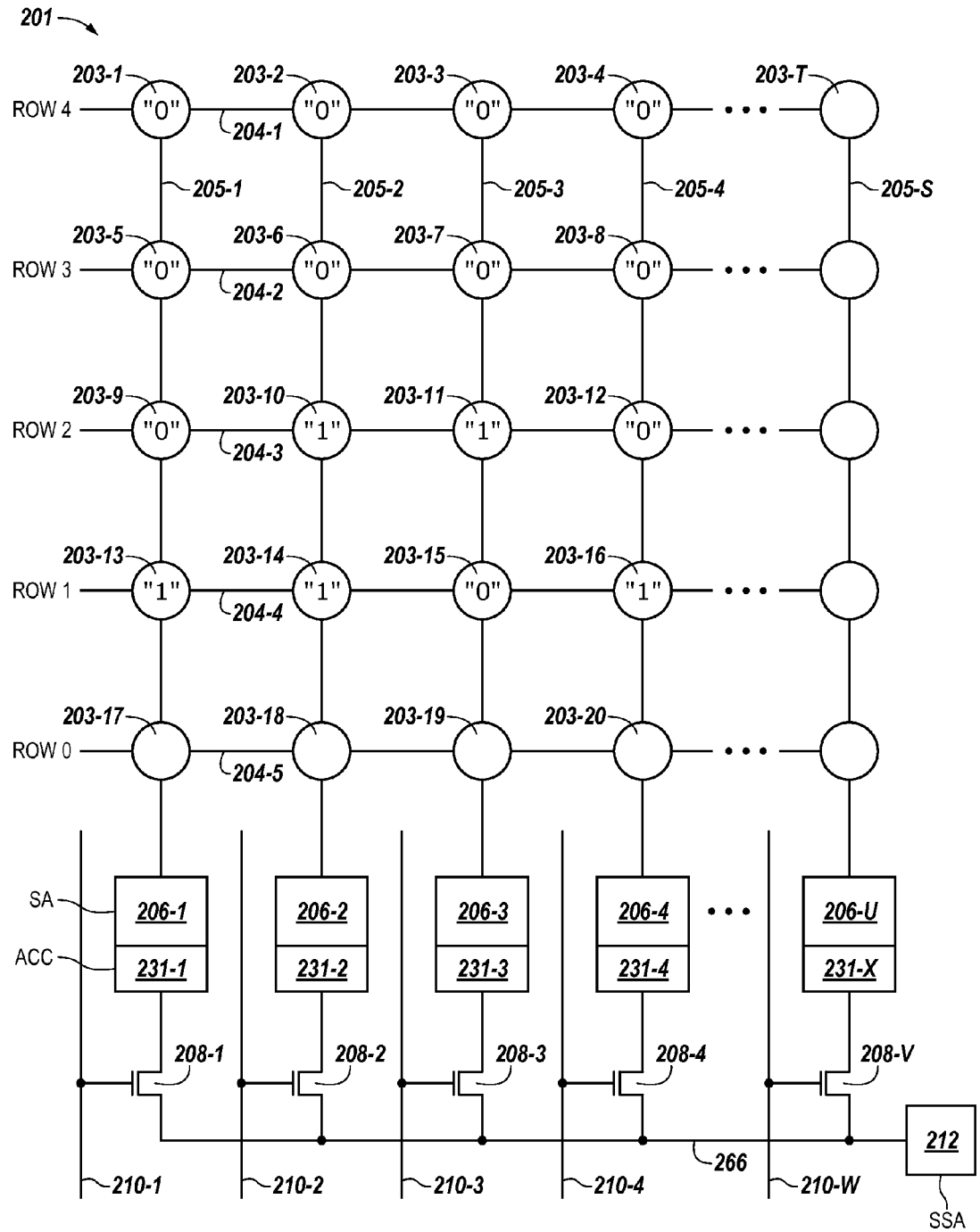
FIG. 2 illustrates a schematic diagram of a portion of a memory array coupled to sensing circuitry in accordance with a number of embodiments of the present disclosure.
Figure 3:
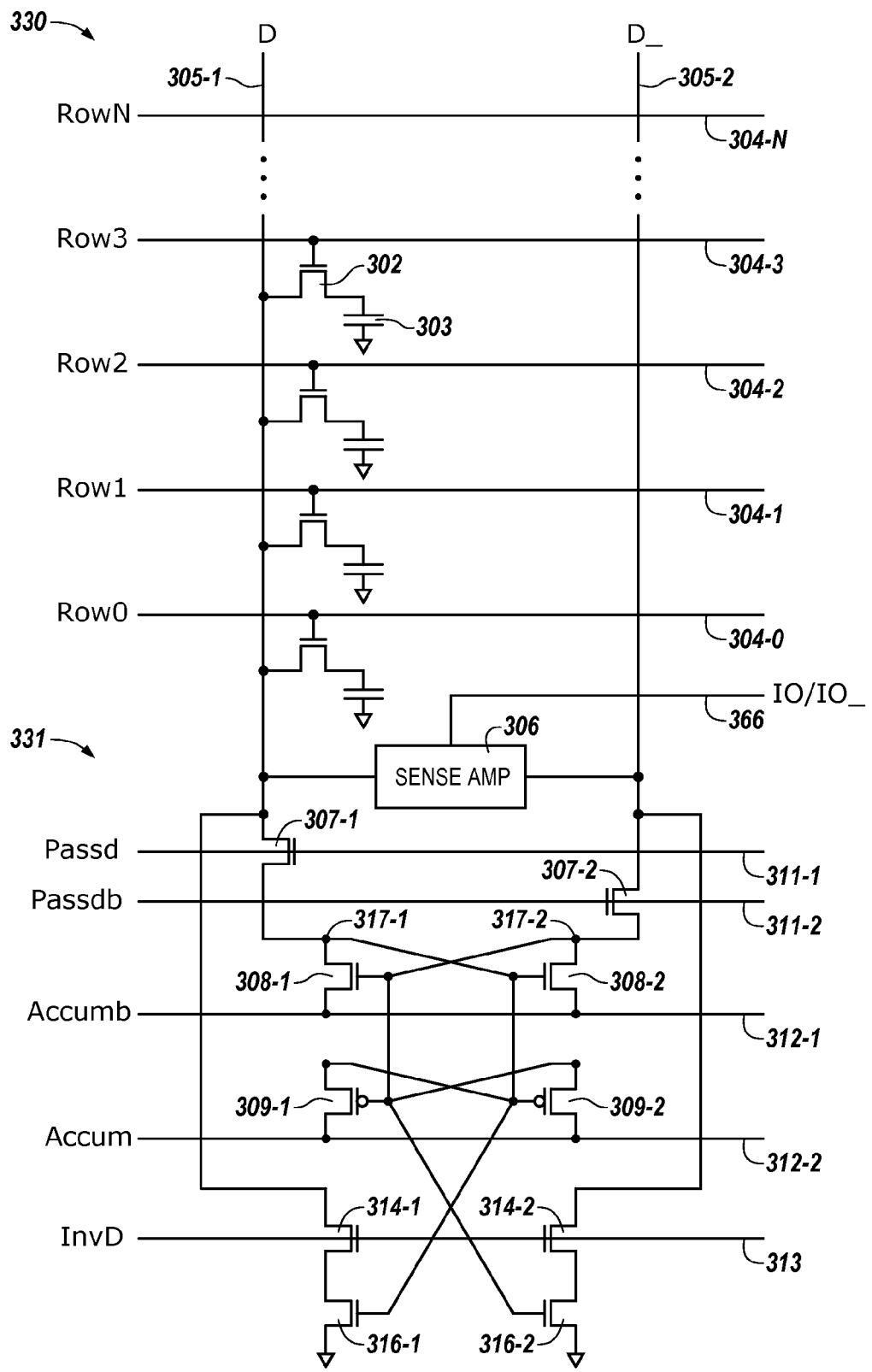
FIG. 3 illustrates a schematic diagram of a portion of a memory array coupled to sensing circuitry in accordance with a number of embodiments of the present disclosure.

The number of logical operations can be performed by an accumulation of data relative to a number of access lines (e.g., see FIG. 3 for discussion of an accumulator). For example, a determination of whether a target data value (e.g., a binary 1 when determining a maximum value and/or a binary 0 when determining a minimum value) is stored in a memory cell coupled to an access line can be performed. For example, if a base ten (10) numerical value is represented by the bit vector 0011 stored in the memory cells coupled to sense line 205-2 in FIG. 2, and the target data value is "1", the highest index access line corresponding to that bit vector that is coupled to a memory cell storing the target data value would be the access line 204-3 (as it is coupled to memory cell 203-10, which stores the first "1" in the bit vector).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "P," "R," etc., particularly with respect to reference numerals in the drawings, can indicate that a number of the particular features so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
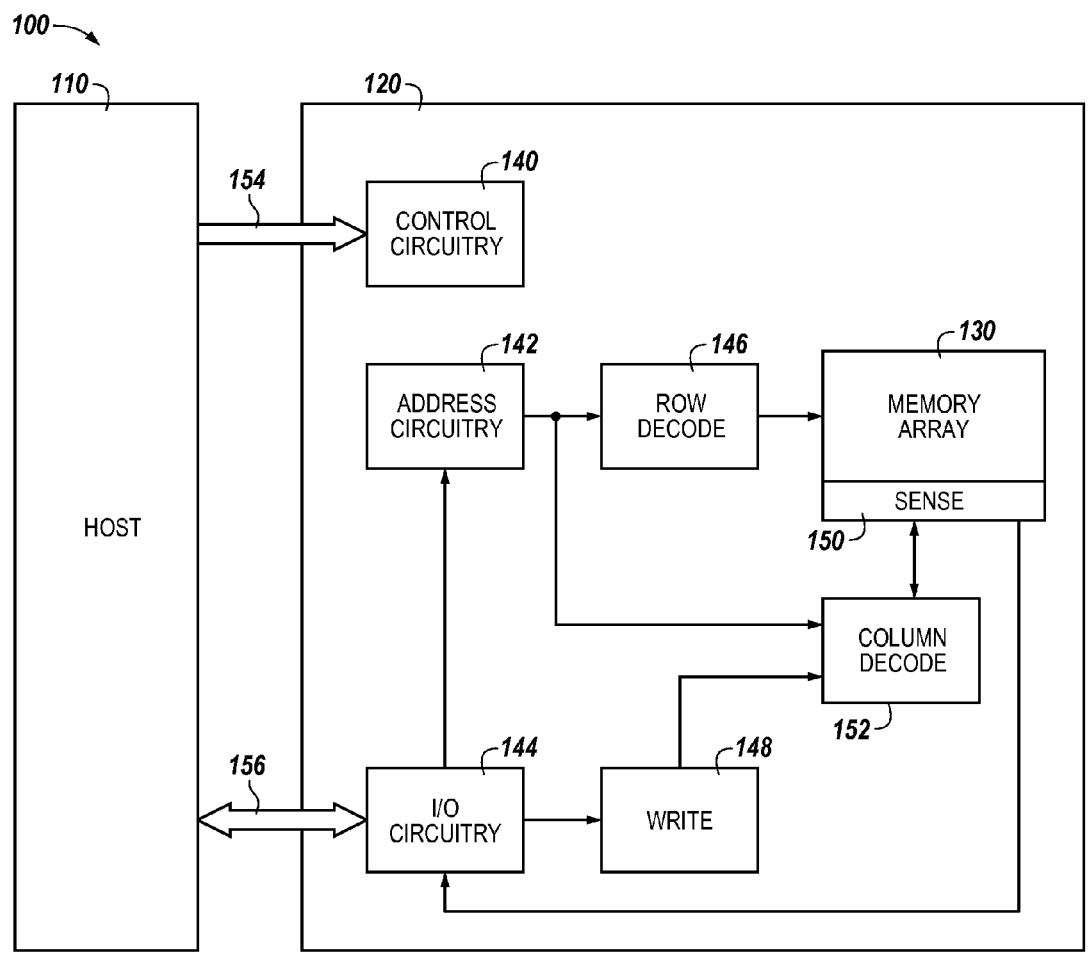
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as row lines, word lines or select lines) and columns coupled by sense lines (which may be referred to herein as bit lines, digit lines, or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller (e.g., an on-die controller).

An example of the sensing circuitry 150 is described further below in association with FIGS. 2, 3, and 4. For instance, in a number of embodiments, the sensing circuitry 150 can comprise a number of sense amplifiers (e.g., sense amplifiers 206-1, . . . , 206-P shown in FIG. 2 or sense amplifier 306 shown in FIG. 3) and a number of accumulators (e.g., accumulators 231-1 through 231-X shown in FIG. 2 and accumulator 331 shown in FIG. 3). As illustrated in FIG. 3, the accumulators can comprise cross-coupled transistors that can serve as a data latches and can be coupled to other sensing circuitry used to perform a number of logical operations (e.g., AND, NOT, NOR, NAND, XOR, etc.). In a number of embodiments, the sensing circuitry (e.g., 150) can be used to perform an AND operation using data stored in array 130 as inputs and store the results of the logical operations back to the array 130 without transferring via a sense line address access (e.g., without firing a column decode signal). As such, various compute functions can be performed within array 130 using sensing circuitry 150 rather than being performed by processing resources external to the sensing circuitry (e.g., by a processor associated with host 110 and/or other processing circuitry, such as ALU circuitry, located on device 120 (e.g., on control circuitry 140 or elsewhere)). In various previous approaches, data associated with an operand, for instance, would be read from memory via sensing circuitry and provided to external ALU circuitry via local I/O lines. The external ALU circuitry would perform compute functions using the operands and the result would be transferred back to the array via the local I/O lines. In contrast, in a number of embodiments of the present disclosure, sensing circuitry (e.g., 150) can be configured to perform logical operations on data stored in memory (e.g., array 130) and store the result to the memory without enabling a separate local I/O line coupled to the sensing circuitry. For example, local I/O can travel off the array 130 chip boundary to other parts of a chip or in an integrated circuit to components other than the array.

FIG. 2 illustrates a schematic diagram of a portion of a memory array 201 coupled to sensing circuitry in accordance with a number of embodiments of the present disclosure. The memory cells (referred to generally as memory cells 203) of the memory array 201 are arranged in rows coupled to access lines (e.g., word lines) 204-1, 204-2, 204-3, 204-4, and 204-5 and in columns coupled to sense lines (e.g., digit lines) 205-1, 205-2, 205-3, 205-4, 205-S. For instance, access line 204-1 includes cells 203-1, 203-2, 203-3, 203-4, . . . , 203-T). Memory array 201 is not limited to a particular number of access lines and/or sense lines. Although not pictured, each column of memory cells can be associated with a corresponding pair of complementary sense lines.

Each column of memory cells can be coupled to a sense amplifier 206-1, 206-2, 206-3, 206-4, . . . , 206-U. The sense amplifiers 206-1 to 206-U are coupled to input/output line 266 (I/O, e.g., local I/O) via transistors 208-1, 208-2, 208-3, 208-4, . . . , 208-V. Each column of memory cells can be coupled to an accumulator 231-1, 231-2, 231-3, 231-4, . . . , 231-X. Column decode lines 210-1 to 210-W are coupled to the gates of transistors 208-1, 208-2, 208-3, 208-4, . . . , 208-V and can be selectively activated to transfer data sensed by respective sense amps 206-1 to 206-U to the secondary sense amplifier 212.

Data values (e.g., binary values) stored in each memory cell of the array can be arranged so that a bit vector is stored vertically in the array. For example, if the memory cells coupled to sense line 205-1 are to store a bit vector representing the base ten (10) numerical value of "1", the binary data values stored in the memory cells 203-1, 203-5, 203-9, and 203-13 could be "0," "0," "0," and "1," respectively (as shown as an example in FIG. 2). As a further example, memory cells 203-2, 203-6, 203-10, and 203-14 can store data values (e.g., the binary data values of "0," "0," "1," and "1" stored in each descending memory cell coupled to sense line 205-2, respectively) to store a bit vector that represents a base ten (10) numerical value (e.g., base ten (10) value) of 3. Continuing with the example shown in FIG. 2, the memory cells coupled to sense line 205-3 can store a bit vector representing the base ten (10) numerical value of 2 (e.g., the binary data values of "0," "0," "1," and "0" could be respectively stored in memory cells 203-3, 203-7, 203-11, and 203-15, respectively) and the memory cells coupled to the sense line 205-4 could store a bit vector representing the base ten (10) numerical value of 1 (e.g., bit vector 0001 stored in respective memory cells 203-4, 203-8, 203-12, and 203-16).

As described further below, embodiments of the present disclosure can be used to determine which particular sense line(s) among a group of sense lines includes cells storing a bit vector representing an extremum value. For instance, in the example shown in FIG. 2, the maximum base ten value among the bit vectors stored in the cells coupled to sense lines 205-1, 205-2, 205-3, and 205-4 is three, as represented by bit vector 0011 stored in respective cells 203-2, 203-6, 203-10, and 203-14. The base ten value of the bit vector associated with sense line 205-1 is one (e.g., 0001), with sense line 205-3 is two (e.g., 0010), and with sense line 205-4 is one (e.g., 0001). In the example shown in FIG. 2, access line 204-1 (ROW 4) represents the highest index (e.g., the most significant bit location such as $2^3$ in this example) access line associated with the stored bit vectors, and access line 204-4 (ROW 1) represents the lowest index (e.g., the least significant bit location such as $2^0$ in this example) access line associated with the stored bit vectors. Embodiments of the present disclosure can be used to determine the location of a stored extremum value. That is, which sense line among the group of sense lines comprises cells storing the maximum data value (e.g., sense line 205-2 in this example), as well as the actual extremum value (e.g., a base ten value of 3 in this example).

Examples of pseudocode associated with identifying an extremum value stored in memory cells in an array is shown below. For instance, an example of pseudocode associated with identifying a maximum value includes:

---
max:

```
ClearAccumulator
InvertAccumulator
WriteRow(destination)
Forall bits in length {
    ReadRow (src[bit])
    if (AccumulatorBlockOr) {
        WriteRow (destination)
        exit-forall
    }
}
Forall remaining bits in length {
    AndRow (src[bit])
    if (AccumulatorBlockOr) {
        WriteRow (destination)
    } else {
        ReadRow (destination)
    }
}
```
---

Example pseudocode associated with identifying a minimum value can include:

---
Min:

```
ClearAccumulator
InvertAccumulator
WriteRow (destination)
Forall bits in length {
    ReadRow (src[bit])
    InvertAccumulator
    If (AccumulatorBlockOr) {
        WriteRow (destination)
        exit-forall
    }
}
Forall remaining bits in length {
    ReadRow (src[bit])
    InvertAccumulator
    AndRow (destination)
    If (AccumulatorBlockOr) {
        WriteRow (destination)
    }
}
```
---

As illustrated in the pseudocode shown above, identifying an extremum value can include an initial operation to clear the accumulators (e.g., accumulators 231-1 through 231-X) coupled to the sense lines 205-1 through 205-S. Clearing the accumulators can include storing a known data value (e.g., "1" or "0") in the accumulators. In some examples, clearing the accumulators can include reading known data values stored in memory cells coupled to a particular access line into the accumulators. For example, memory cells coupled to a particular access line could store a binary value of "1," and the binary "1" could be read into each accumulator such that all accumulators store binary "1.". In this way, the accumulators can be set to a known data value in order to zero out data values that may have been previously stored in the accumulators. As indicated in the example pseudocode above, the accumulators can also be operated to invert the data values stored therein (e.g., a binary "0" can be inverted to a binary "1" and vice versa) in association with identifying an extremum value. Operation of the accumulators (e.g., 231-1 to 231-X) will be described further in association with FIG. 3.

The data values stored in the accumulators (e.g., after clearing and/or inverting), can be written to memory cells coupled to a particular access line (e.g., a destination access line such as access line 204-5), as indicated by "WriteRow (destination)" in the example pseudocode shown above. For instance, the access line (e.g., 204-5) corresponding to the "destination row" can be activated, and the data values stored in the accumulators 231-1 through 231-X can be driven onto the corresponding sense lines and written to the corresponding memory cells coupled to the destination row (e.g., ROW 0). Therefore, the cells coupled to the destination row can store a known data value (e.g., "1" or "0"), which can then be used as an initial bit-mask in association with identifying an extremum value as described further below.

In a number of embodiments, identifying an extremum value can include determining the access line with a highest associated index having one or more cells storing a target data value (e.g., binary "1"). For instance, a determination can be made as to whether the access line (e.g., 204-1) having the highest associated index (e.g., the most-significant access line) includes a cell storing the target data value. The determination as to whether the most-significant access line includes cells storing the target data value can be made, for instance, by reading the data values stored in the memory cells coupled to the most-significant access line 204-1 into the accumulators 231-1 through 231-X (e.g., as shown in the above pseudocode as "ReadRow(src[bit])". An "OR" operation can be performed to determine whether one or more of the accumulators store the target data value (e.g., as indicated by "if(AccumulatorBlockOr)" shown in the above pseudocode).

An example "OR" operation (which may be referred to herein as a "BlockOR" operation or an "Accumulator-BlockOr") can include determining whether a target data value (e.g., "1") is stored in one or more memory cells coupled to a particular access line (e.g., 204-1). Performing a BlockOR operation can include charging (e.g., precharging) the local I/O line 266 coupled to the secondary sense amplifier 212 to a particular voltage. The I/O line 266 can be precharged (e.g., via control circuitry such as control circuitry 140 shown in FIG. 1 and/or sensing circuitry such as circuitry 150 shown in FIG. 1) to a voltage such as a supply voltage (e.g., Vcc) or a ground voltage (e.g., 0V).

A BlockOR operation can include sensing (e.g., reading) the cells coupled to a selected access line using the sense amplifiers (e.g., 206-1 to 206-U). The sense amplifiers can amplify a differential voltage signal (e.g., between complementary sense lines such as 305-1 and 305-2 shown in FIG. 3) corresponding to a particular data value (e.g., "1" or "0"). For example, a supply voltage (e.g., Vcc) may correspond to a logic 1 and a ground voltage may correspond to a logic 0.

The sensed data values can be stored in the corresponding accumulators (e.g., 231-1 to 231-X).

To perform a BlockOR operation, the column decode lines (e.g., 210-1 to 210-W) coupled to the selected cells can be activated in parallel (e.g., such that respective transistors 208-1 to 208-V are turned on) in order to transfer the voltages on the corresponding sense lines to the local I/O line 266. The sensing circuitry (e.g., SSA 212) can sense whether the precharged voltage of the local I/O line 266 changes (e.g., by more than a threshold amount) responsive to activation of the column decode lines.

For instance, if the I/O line 266 is precharged to Vcc and one or more of the selected cells coupled to the selected access line stores a logic 0 (e.g., 0V), then the SSA 212 can sense a pull down (e.g., decrease) of the voltage on I/O line 266. Alternatively, if the I/O line 266 is precharged to a ground voltage and one or more of the selected cells coupled to the selected access line stores a logic 1 (e.g., Vcc), then the SSA 212 can sense a pull up (e.g., increase) of the voltage on I/O line 266. The determination of whether one or more selected cells coupled to a selected access line stores a particular data value is effectively performing a logic "OR" operation. In this manner, voltages corresponding to data sensed by the sense amps 206-1 to 206-U and/or stored in accumulators 231-1 to 231-X can be transferred, in parallel, to the local I/O line 266 and sensed by SSA 212 as part of a BlockOR operation. Embodiments of the present disclosure are not limited to particular precharge voltages of local I/O line 266 and/or to particular voltage values corresponding to logic 1 or logic 0.

It is noted that the BlockOR operation may be performed on data values stored in the accumulators or on data values stored in the sense amplifiers. For instance, as shown in FIG. 3, the sensing circuitry includes pass transistors 307-1 and 307-2 that can be turned off to decouple the cross-coupled transistor pairs 308-1/308-2 and 309-1/309-2 from the complementary sense lines 305-1/305-2. As such, data values sensed by sense amps 206-1 to 206-U may be transferred to SSA 212, without first being stored in accumulators 231-1 to 231-X, in a number of embodiments. Embodiments are not limited to the particular BlockOR operation described above.

In the example shown in FIG. 2, a BlockOR operation performed on the data stored in cells 203-1, 203-2, 203-3, and 203-4 coupled to the most-significant access line 204-1 will result in a determination that none of the cells stores the target data value (e.g., "1"). As such, the SSA 212 can store a "0," which can indicate the result of the BlockOR. The result of the BlockOR can be transferred from SSA 212 to other sensing circuitry and/or to control circuitry (e.g., control circuitry 140 shown in FIG. 1). Since none of the cells coupled to the most-significant access line 204-1 store the target data value, the "WriteRow(destination)" shown in the "if (AccumulatorBlockOR)" loop does not occur, and a BlockOR is performed on the data stored in the cells 203-5, 203-6, 203-7, and 203-8 coupled to the next most-significant access line 204-2. For instance, the data stored by the cells coupled to access line 204-2 are read into the accumulators 231-1 to 231-4, and the corresponding voltages are provided to local I/O line 266 via activation of column decode lines 210-1 to 210-4. Since none of the cells coupled to access line 204-2 store a "1," the SSA 212 will not sense a threshold amount of voltage change on I/O line 266 and the SSA 212 can again store a "0," indicating the result of the BlockOR operation. Since none of the cells coupled to access line 204-2 stored the target data value, a BlockOR is performed on the cells 203-9, 203-10, 203-11, and 203-12 coupled to the next most-significant access line 204-3. In this example, cells 203-10 and 203-11 store the target data value (e.g., logic "1"). As such, the SSA will detect a change in the precharged voltage of local I/O line 266 as part of the BlockOR operation, indicating that one or more of the cells stores the target data value. Therefore, the SSA 212 can store a "1," which can indicate the result of the BlockOR (e.g., that one or more cells was determined to store a logic "1"). The result indicates that access line 204-3 is the highest index access line having one or more cells coupled thereto storing the target data value.

In accordance with the example pseudocode shown above, the data values stored in cells 203-9, 203-10, 203-11, and 203-12 of access line 204-3 are written to the corresponding cells of destination row 204-5 (e.g., as part of the "WriteRow(destination)" step in the first "if" clause). As such, the data values stored in cells 203-9, 203-10, 203-11, and 203-12, which were read into respective accumulators 231-1, 231-2, 231-3, and 231-4, are written to the cells 203-17, 203-18, 203-19, and 203-20 of destination row 204-5. Therefore, upon exiting the "forall bits in length" loop shown in the above pseudocode, cells 203-17, 203-18, 203-19, and 203-20 store "0," "1," "1," and "0," respectively, and those data values can serve as a bit mask for the "forall remaining bits in length" loop indicated in the above pseudocode.

In a number of embodiments, identifying an extremum value can include performing a number of AND operations in association with determining which sense line from among a number of sense lines comprises cells coupled thereto storing the extremum value. For example, the "forall remaining bits in length" loop shown in the above pseudocode can be used. As described below, and as indicated in the above pseudocode, a number of AND operations and BlockOR operations can be performed on a next-most-significant access line basis. During the process of performing the operations on the access line by access line basis, the data values stored in the cells of the destination row can serve as a bit mask for subsequent access lines. A result indicating which one or more of the sense lines includes cells coupled thereto storing the extremum value can be stored in the cells of the destination row (e.g., 204-5), such that after the above process is performed on the least significant access line, the destination row (e.g., 204-5) can be read (e.g., see "ReadRow(destination)" in the above pseudocode) to determine the sense line(s) storing the extremum value (in their respective cells).

As an example, an AND operation can be performed (e.g., "ANDRow(src[bit])" shown in the above pseudocode), by using the corresponding accumulators 231-1 through 231-4, on the data values stored in the destination row 204-5 (corresponding to the data stored in memory cell 203-9 through 203-12 that are coupled to the access line storing most-significant bit data) and the data values stored in the memory cells coupled to the access line storing next-most significant bit data (e.g., the memory cells coupled to access line 204-4). The result of the AND operations can be stored in the corresponding accumulators. Further discussion of operation of the accumulator(s) to perform an AND operation is described below in association with FIG. 3.

In the above example, the binary data values "0," "1," "1," and "0" stored in respective memory cells 203-17, 203-18, 203-19, and 203-20 of destination row 204-5, and serving as a bit-mask, can be AND-ed with the data values "1," "1," "0," and "1" stored in the corresponding respective memory cells 203-13, 203-14, 203-15, and 203-16 coupled to access line 204-4. The results of the AND operations can be stored in the corresponding accumulators 231-1 to 231-4. In this example, an AND operation results in the accumulator 231-1 storing a "0" (e.g., the result of ANDing binary value "0" stored in cell 203-17 and binary value "1" stored in cell 203-13). The AND operation also results in the accumulator 231-2 storing a "1" (e.g., the result of ANDing binary value "1" stored in cell 203-18 and binary value "1" stored in cell 203-14), the accumulator 231-3 storing a "0" (e.g., the result of ANDing binary value "1" stored in cell 203-19 and binary value "0" stored in cell 203-15), and accumulator 231-4 storing a "0" (e.g., the result of ANDing binary value "0" stored in cell 203-20 and binary value "1" stored in cell 203-16). In other words, the output of the AND operation can be binary values "0," "1," "0," and "0," which would be stored in accumulators 231-1, 231-2, 231-3, and 231-4, respectively.

As indicated by the second "if" statement (e.g., "if (AccumulatorBlockOr)") shown in the above pseudocode, a BlockOR operation can be performed on the "ANDed" data stored in the accumulators. The BlockOR operation can be used to determine whether one or more of the output values of the AND operation performed on the cells of a particular access line and the cells of the bit mask (e.g., the cells of the destination row) includes the target data value (e.g., "1"). If the BlockOR result of the ANDed values is a binary "1," (e.g., one or more of the cells of the destination row stores a "1" and the cell it is ANDed with also stores a "1") then the result of the AND operations (which are stored in the corresponding accumulators) are written to the cells of the destination row (e.g., "WriteRow(destination)"). The data values stored in the cells of the destination row then serve as a bit mask for the next subsequently less significant access line, or they indicate (via a stored value of "1") which sense line(s) store the extremum value of the corresponding stored bit vectors. If the BlockOR result of the ANDed values is a binary "0," (e.g., none of the cells being ANDed with the cells of the destination row store a "1" and match a "1" stored in destination row), then the result of the AND operations (which are stored in the corresponding accumulators) are not written to the cells of the destination row (e.g., the bit mask stored in the cells of the destination row remains unchanged). The unchanged data values stored in the cells of the destination row still serve as a bit mask for the next subsequently less significant access line, or they indicate (via a stored value of "1") which sense line(s) store the extremum value of the corresponding bit vectors stored in the cells of the respective sense lines. As the above process continues on a next less significant access line basis, the number of binary "1s" stored in the cells of the destination row is reduced until at the end of the process, the cells of the destination row (e.g., the bit mask) that still store a "1" indicate which sense line(s) store the extremum value.

With reference to the example shown in FIG. 2, the result of a BlockOr performed on the data values stored in the accumulators 231-1, 231-2, 231-3, and 231-4 (e.g., the bit mask values stored in cells 203-17, 203-18, 203-19, and 203-20 of destination row 204-5) ANDed with the values stored in the cells 203-13, 203-14, 203-15, and 203-15 of the selected access line 204-4 is a binary "1." That is, after the AND operation, the accumulators 231-1, 231-2, 231-3, and 231-4 store the data values "0," "1," "0," and "0," respectively. As such, since one or more of the ANDed data values is a "1," the result of the BlockOr is "1." Since the BlockOr results in a "1," the data values currently stored in the accumulators are written to the corresponding destination row cells such that cells 203-17, 203-18, 203-19, and 203-20 of destination row 204-5 store the data values "0," "1," "0,"

and "0," respectively. Furthermore, since access line 204-4 is the least significant access line, the data values stored in the cells of the destination row 204-5 now indicate the sense line having cells storing the extremum value (e.g., a maximum value in this example).

In a number of embodiments, the value of the extremum can be identified. For instance, after completion of the above process, the data values stored in the cells of the destination row (e.g., the bit mask) can be read and can be reported to control circuitry (e.g., control circuitry 140 shown in FIG. 1). In this example, the target value of "1" would be stored in cell 203-18, while the data values of cells 203-17, 203-19, and 203-20 would store a "0." As such, the sense line 205-2 is determined to be the sense line from among the group of sense lines (e.g., 105-1 to 205-4) that includes cells storing the bit vector corresponding to the extremum (e.g., binary value "0011" or decimal value "3"). The value of the data stored as a bit vector can be identified, for instance, by reading the cells coupled to the sense line(s) determined to include cells storing the extremum. In this example, cells 203-2, 203-6, 203-10, and 203-14 can be read and the data values stored therein can be reported to control circuitry, or instance, to identify the value of bit vector stored in those cells. The above referenced operations are not limited to determining a maximum value and can determine a number of extremum values. For instance, example pseudocode associated with determining a minimum value is illustrated above.

Determining a minimum value among a set of data stored as vectors in an array can be done in a similar manner as that described above in association with determining a maximum value. However, in determining a minimum value, a binary "0" can be used as the target value. As such, performing BlockOr and/or AND operations as described above can include determining whether one or more cells stores a binary "0" as opposed to a binary "1." In a number of embodiments, the accumulators can be operated to invert data values stored therein. That is, a stored value of "1" in an accumulator can be inverted to a "0" and a stored value of "0" in an accumulator can be inverted to a "1." An invert operation will be described further below in association with FIG. 3.

As one example, assume that as part of identifying a minimum data value among a number of data values stored as vectors, one wants to determine whether one or more of four cells coupled to a particular access line stores binary "0" (e.g., as part of the "forall bits in length" loop shown in the pseudocode above). Also assume that the cell coupled to a first sense line stores the data value "1," the cell coupled to a second sense line stores the data value "1," the cell coupled to a third sense line stores the data value "0," and the cell coupled to a fourth sense line stores the data value "1." In order to determine whether one or more of the cells stores a "1," the data can be read into four corresponding accumulators and a BlockOr operation can be performed, as described above. However, in order to determine whether one or more of the cells stores a "0," the data read into the accumulators can be inverted such that the accumulator coupled to the first sense line stores a "0," the accumulator coupled to the second sense line stores a "0," the accumulator coupled to the third sense line stores a "1," and the accumulator coupled to the fourth sense line stores a "0." That is, the BlockOr operation is performed on the inverse of the data values read into the accumulators from the cells of the particular access line. Essentially, inverting the data values stored in the accumulators as part of the execution of the above pseudocode provides a manner for determining whether one or more particular cells stores a binary "0" as opposed to determining whether one or more particular cells stores a binary "1." Therefore, a similar method used for determining a maximum stored bit vector value can be used for determining a minimum stored bit vector value.

FIG. 3 illustrates a schematic diagram of a portion of a memory array 330 coupled to sensing circuitry in accordance with a number of embodiments of the present disclosureIn this example, the memory array 330 is a DRAM array of 1T1C (one transistor one capacitor) memory cells each comprised of an access device 302 (e.g., transistor) and a storage element 303 (e.g., a capacitor). Embodiments, however, are not limited to this example and other storage element array types may be included, e.g., cross point arrays having PCRAM memory elements, etc. The cells of array 330 are arranged in rows coupled by word lines 304-0 (Row0), 304-1 (Row1), 304-2, (Row2) 304-3 (Row3), . . . , 304-N (RowN) and columns coupled by sense lines (e.g., digit lines) 305-1 (D) and 305-2 (D_). In this example, each column of cells is associated with a pair of complementary sense lines 305-1 (D) and 305-2 (D_).

In a number of embodiments, an accumulator (e.g., 331) can comprise a number of transistors formed on pitch with the transistors of a sense amp (e.g., 306) and/or the memory cells of the array (e.g., 330), which may conform to a particular feature size (e.g., $4F^2$, $6F^2$, etc.). As described further below, the accumulator 331 can, in conjunction with the sense amp 306, operate to perforin various compute operations using data from array 330 as input and store the result back to the array 330 without transferring the data via a sense line address access (e.g., without firing a column decode signal such that data is transferred to circuitry external from the array and sensing circuitry via local local I/O lines (e.g., 266-1 in FIG. 2).

In the example illustrated in FIG. 3, the circuitry corresponding to accumulator 331 comprises five transistors coupled to each of the sense lines D and D_; however, embodiments are not limited to this example. Transistors 307-1 and 307-2 have a first source/drain region coupled to sense lines D and D_, respectively, and a second source/drain region coupled to a cross coupled latch (e.g., coupled to gates of a pair of cross coupled transistors, such as cross coupled NMOS transistors 308-1 and 308-2 and cross coupled PMOS transistors 309-1 and 309-2. As described further herein, the cross coupled latch comprising transistors 308-1, 308-2, 309-1, and 309-2 can be referred to as a secondary latch (the cross coupled latch corresponding to sense amp 306 can be referred to herein as a primary latch).

The transistors 307-1 and 307-2 can be referred to as pass transistors, which can be enabled via respective signals 311-1 (Passd) and 311-2 (Passdb) in order to pass the voltages or currents on the respective sense lines D and D_ to the inputs of the cross coupled latch comprising transistors 308-1, 308-2, 309-1, and 309-2 (e.g., the input of the secondary latch). In this example, the second source/drain region of transistor 307-1 is coupled to a first source/drain region of transistors 308-1 and 309-1 as well as to the gates of transistors 308-2 and 309-2. Similarly, the second source/drain region of transistor 307-2 is coupled to a first source/drain region of transistors 308-2 and 309-2 as well as to the gates of transistors 308-1 and 309-1.

A second source/drain region of transistor 308-1 and 308-2 is commonly coupled to a negative control signal 312-1 (Accumb). A second source/drain region of transistors 309-1 and 309-2 is commonly coupled to a positive control signal 312-2 (Accum). The Accum signal 312-2 can be a supply voltage (e.g., Vcc) and the Accumb signal can be a reference voltage (e.g., ground). Enabling signals 312-1 and 312-2 activates the cross coupled latch comprising transistors 308-1, 308-2, 309-1, and 309-2 corresponding to the secondary latch. The activated sense amp pair operates to amplify a differential voltage between common node 317-1 and common node 317-2 such that node 317-1 is driven to one of the Accum signal voltage and the Accumb signal voltage (e.g., to one of Vcc and ground), and node 317-2 is driven to the other of the Accum signal voltage and the Accumb signal voltage. As described further below, the signals 312-1 and 312-2 are labeled "Accum" and "Accumb" because the secondary latch can serve as an accumulator while being used to perform a logical operation (e.g., an AND operation). In a number of embodiments, an accumulator comprises the cross coupled transistors 308-1, 308-2, 309-1, and 309-2 forming the secondary latch as well as the pass transistors 307-1 and 308-2.

In this example, the accumulator 331 also includes inverting transistors 314-1 and 314-2 having a first source/drain region coupled to the respective digit lines D and D_. A second source/drain region of the transistors 314-1 and 314-2 is coupled to a first source/drain region of transistors 316-1 and 316-2, respectively. The second source/drain region of transistors 316-1 and 316-2 can be coupled to a ground. The gates of transistors 314-1 and 314-2 are coupled to a signal 313 (InvD). The gate of transistor 316-1 is coupled to the common node 317-1 to which the gate of transistor 308-2, the gate of transistor 309-2, and the first source/drain region of transistor 308-1 are also coupled. In a complementary fashion, the gate of transistor 316-2 is coupled to the common node 317-2 to which the gate of transistor 308-1, the gate of transistor 309-1, and the first source/drain region of transistor 308-2 are also coupled. As such, an invert operation can be performed by enabling signal InvD, which inverts the data value stored in the secondary latch and drives the inverted value onto sense lines 305-1 and 305-2.

In a number of embodiments, and as indicated above in association with FIG. 2, the accumulator can be used to perform AND operations in association with identifying an extremum value. For example, a data value stored in a particular cell can be sensed by a corresponding sense amp 306. The data value can be transferred to the data latch of the accumulator 331 by activating the Passd (311-1) and Passdb (311-2) signals as well as the Accumb (312-1) and Accum signals (312-2). To AND the data value stored in the accumulator with a data value stored in a different particular cell coupled to a same sense line, the access line to which the different particular cell is coupled can be activated. The sense amp 306 can be activated (e.g., fired), which amplifies the differential signal on sense lines 305-1 and 305-2. Activating only Passd (311-1) (e.g., while maintaining Passdb (311-2) in a deactivated state) results in accumulating the data value corresponding to the voltage signal on sense line 305-1 (e.g., Vcc corresponding to logic "1" or ground corresponding to logic "0"). The Accumb and Accum signals remain activated during the AND operation.

Therefore, if the data value stored in the different particular cell (and sensed by sense amp 306) is a logic "0", then value stored in the secondary latch of the accumulator is asserted low (e.g., ground voltage such as 0V), such that it stores a logic "0." However, if the value stored in the different particular cell (and sensed by sense amp 306) is not a logic "0," then the secondary latch of the accumulator retains its previous value. Therefore, the accumulator will only store a logic "1" if it previously stored a logic "1" and the different particular cell also stores a logic "1." Hence, the accumulator 331 is operated to perform a logic AND operation. As noted above, the invert signal 313 can be activated in order to invert the data value stored by the accumulator 331, which can be used, for example, in identifying a minimum data value as described above.

Figure 4:
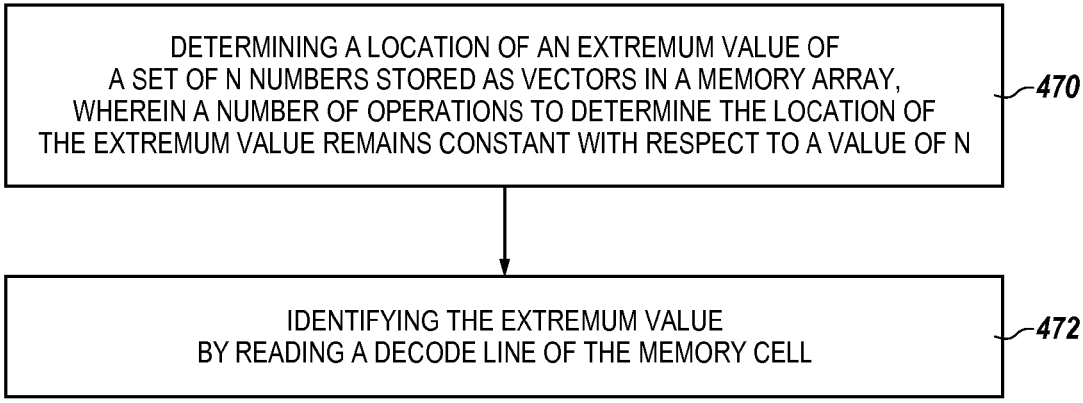
FIG. 4 illustrates an example of a method for identifying an extremum in accordance with a number of embodiments of the present disclosure.

FIG. 4 illustrates an example of a method for identifying an extremum value in accordance with a number of embodiments of the present disclosure. At block 470, the method includes determining a location of an extremum value of a set of N stored as vectors in a memory array. Determining a location of the extremum value can include a number of operations that remain constant with respect to a value of N. That is, the number of operations to determine a location of an extremum value can remain constant as the value of N is increased and/or decreased. The set of N can be stored as bit vectors in the memory array. Each bit vector can represent a numerical base ten (10) number. For example, a bit vector of four memory cells (e.g., memory cells 203-2, 203-6, 203-10, and 203-14 in FIG. 2) can store a binary value in each of the four memory cells (e.g., binary values "0," "0," "1," and "1," respectively) representing a base ten (10) numerical value (e.g., numerical value 3).

The number of operations to determine the extremum value can change with respect to a number of row lines used to encode numerical values (e.g., base ten (10) numerical values) in a vector (e.g., a bit vector). For example, a base ten (10) numerical value stored vertically in 10 memory cells coupled to a sense line (corresponding to 10 binary values representing the base ten (10) numerical value) can take a different number of operations (e.g., fewer operations) to determine an extremum value than a base ten (10) numerical value stored vertically in 100 memory cells. The number of operations to determine the extremum value can include determining whether a target data value is stored in a memory cell. In one example, the target data value can include a binary value of "1" when determining a location of a maximum value. In one example, the target data value can include a binary value of "0" when determining a minimum value. However, embodiments are not limited to a particular target binary value when representing an extremum value.

At block 472, the method can include determining the extremum value by reading memory cells coupled to a sense line based on the determined location of the extremum value. For example, in FIG. 2, memory cell 203-14 can be determined to store a target data value (e.g., binary value of "1") from an AND operation (e.g., performing an AND operation of binary value "1" in memory cell 203-14 with binary value "1" in memory cell 203-10) indicating a maximum value. The indication can be based on a number of operations that determine memory cells coupled to other sense lines do not include the target data value while performing an operation.

Figure 5:
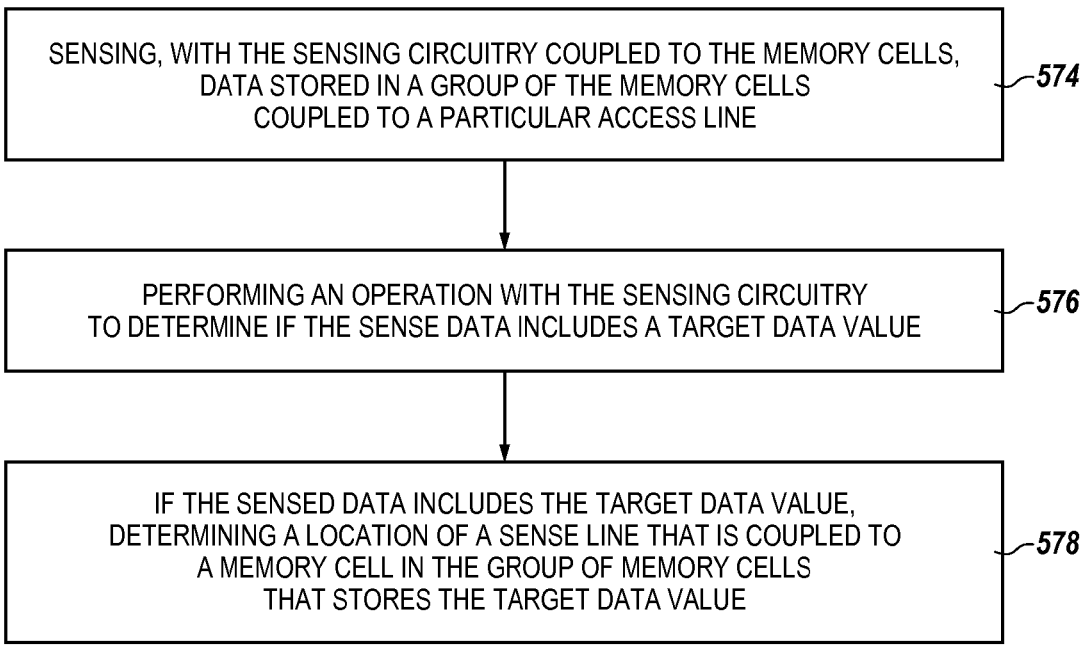
FIG. 5 illustrates an example of a method for identifying an extremum in accordance with a number of embodiments of the present disclosure.

FIG. 5 illustrates an example of a method for identifying an extremum value in accordance with a number of embodiments of the present disclosure. The extremum value can include a maximum value or a minimum value. When determining a maximum value, a target data value can include a binary 1. When determining a minimum value, a target data value can include a binary 0. A group of memory cells can include a number of cells coupled to a particular access line (e.g., row) of an array of memory cells. A vector can be stored in cells coupled to a respective sense line (e.g., column) of the array of memory cells and each memory cell in the row can be coupled to a respective sense line of a plurality of sense lines. A plurality of extremums can be determined. For example, if there are a plurality of sense lines storing a same extremum bit-vector value in cells coupled thereto, a plurality of extremums can be determined and located. A determination of a plurality of sense lines that are coupled to memory cells in the group of memory cells that stored the target data value can be performed.

At block 574, the method can include sensing, with the sensing circuitry coupled to the memory cells, data stored in a group of the memory cells coupled to a particular access line. The sensing can include reading a row of memory cells of an array of memory cells. The method can include reading data stored in memory cells coupled to the sense line to determine a value of an extremum. The sensed data stored in a group of the memory cells (e.g., memory cells 203-9 through 203-12 in FIG. 2 ("Row 2") can be stored in a group of memory cells coupled to a destination access line (e.g., access line 204-5 in FIG. 2 ("Row 0")). The method can include storing a bit mask in the group of memory cells coupled to the destination access line prior to sensing the data stored in the group of memory cells coupled to the particular access line. The bit mask can include the data stored in the group of memory cells coupled to the particular access line.

The method can include inverting data values stored in a number of accumulators associated with the group of memory cells prior to sensing the data stored in the group of memory cells coupled to the particular access line. The method can include clearing out data values previously stored in the number of accumulators by storing default data values prior to inverting the default data values stored in the number of accumulators. The method can include performing a second inversion of the data values stored in the number of accumulators that correspond to data stored in the group of memory cells coupled to the particular access line values stored in the number of accumulators after sensing the data stored in the group of memory cells coupled to the particular access line and before performing the operation with the sensing circuitry to determine if the sensed data includes the target data value. The method can include inverting the data stored in the other access line corresponding to a next-lower index of the vector prior to comparing the data stored in the group of memory cells coupled to the destination access line to the data stored in the group of memory cells coupled to the other access line to provide the output data.

At block 576, the method can include performing an operation with the sensing circuitry to determine if the sensed data includes a target data value. Performing an operation with the sensing circuitry to determine if the sensed data includes the target data value can include performing a BlockOR operation with an accumulator of the sensing circuitry as described above. The BlockOR operation performed with an accumulator of the sensing circuitry can include charging an I/O line to a level corresponding to the target data value. The BlockOR operation can include transferring the sensed data from a plurality of sense amplifiers to the I/O line. The BlockOR operation can include determining whether the level of the I/O line changes responsive to transferring the sensed data. Determining whether the level of the I/O line changes can include detecting, with a secondary sense amplifier, whether the level changes by at least a threshold amount. The level changing by a threshold amount can indicate that the sensed data stores the target data value.

At block 578, the method can include determining, if the sensed data includes the target data value, a location of a sense line that is coupled to a memory cell in a group of memory cells that stores a target data value. The determination can include a comparison (e.g., performing an AND operation) of data stored in a group of memory cells coupled to the destination access line (e.g., access line 204-5 in FIG. 2) to data stored in a group of memory cells coupled to another access line (e.g., access line 204-4 in FIG. 2 ("Row 1")) to provide output data. The another access line can correspond to a lower index of the vectors than the particular access line (e.g., memory cells coupled to access line 204-4 store a lower index of values than the memory cells coupled to access line 204-3).

An operation (e.g., a BlockOR operation) can be performed on the output data from the comparison using sensing circuitry to determine if the output data includes a target data value (e.g., a binary value "1"). If the output data includes a target data value, a determination can be made to determine a location of a sense line that is coupled to a memory cell in the group of memory cells coupled to the other access line that stores the target data value. Determining a location of the sense line that is coupled to the memory cell in the group of memory cells coupled to a particular access line that stores the target data value can include comparing the data stored in the group of memory cells coupled to the destination access line to data stored in a group of the memory cells coupled to a next-most significant access line to provide additional output data. The next-most significant access line can correspond to a lower index of the vectors than the other access line. Determining a location of the sense line that stores the target data value can include performing an operation with the sensing circuitry to determine if the additional output data includes the target data value (e.g., an additional BlockOR operation). If the additional output data includes the target data value, a determination of a location of a sense line that is coupled to a memory cell in the group of memory cells coupled to the next-most significant access line that stores the target data value can be performed.

The comparison of a most-significant access line storing data values with a next-most significant access line storing data values can include repeating the comparison and the determination whether the additional output data includes the target data value for each access line corresponding to a lower index of the vectors than the next-most significant access line and, if the respective output data includes the target data value, determining a location of a sense line that is coupled to a memory cell in the group of memory cells coupled to the respective access line that stores the target data value.

If the sense data does not include a target data value, the method can include sensing, with the sensing circuitry coupled to the array of memory cells, data stored in a group of the memory cells coupled to another access line. The other access line can correspond to a lower index of the vectors than the particular access line. If the sense data does not include a target data value, the method can include performing an operation with sensing circuitry to determine if the data sensed from the group of memory cells coupled to the other access line includes the target data value (e.g., performing a BlockOR operation on the memory cells coupled to the next-most significant access line). If the data sensed from the group of memory cells coupled to the other access line includes the target data value, the method can include determining a location of a sense line that is coupled to a memory cell in the group of memory cells coupled to the other access line that stores the target data value.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for identifying an extremum value, comprising:
    determining a location of an extremum value of a set of N data values stored as vectors in a memory array, wherein a number of operations to determine the location of the extremum value remains constant with respect to a value of N.

2. The method of claim 1, wherein the number of operations to determine the extremum value changes with respect to a length of the vectors.

3. The method of claim 1, wherein the vectors in the memory array are bit vectors, wherein each bit vector represents a respective numerical value.

4. The method of claim 1, comprising identifying the extremum value by reading a sense line based on the determined location of the extremum value.

5. The method of claim 1, wherein each data value of the set of N data values is stored in a respective plurality of memory cells coupled to a respective sense line of a set of N sense lines.

6. The method of claim 1, wherein the extremum value comprises a maximum value.

7. The method of claim 1, wherein the extremum value comprises a minimum value.

8. An apparatus, comprising:
    an array of memory cells;
    a controller coupled to the array and configured to cause:
        sensing circuitry to sense a first number of memory cells coupled to a first access line to determine if one or more of the first number of memory cells stores a target data value, wherein the first access line corresponds to a highest index of a number of bit vectors stored in the array; sense a second number of memory cells coupled to a second access line corresponding to a lower index of the number of bit vectors;
        responsive to a determination that the target data value is stored in one or more memory cells of the first number of memory cells, comparing of the data stored in the first number of memory cells to the data stored in the second number of memory cells; and
        responsive to a result of the comparison indicating one or more memory cell of the first number of memory cells stores the target data value and is coupled to a same sense line as a memory cell of the second number of memory cells that also stores the target data value, storing of the result of the comparison in the array of memory cells.

9. A method for identifying an extremum in a set of data stored as vectors in an array of memory cells, the method comprising:
    sensing, with sensing circuitry coupled to the array of memory cells, data stored in a group of the memory cells coupled to a particular access line;
    performing an operation with the sensing circuitry to determine if the sensed data includes a target data value; and
    if the sensed data includes the target data value, determining a location of a sense line that is coupled to a memory cell in the group of memory cells that stores the target data value.

10. The method of claim 9, wherein determining a location of a sense line that is coupled to a memory cell in the group of memory cells that stores the target data value comprises storing the sensed data in a group of the memory cells coupled to a destination access line.

11. The method of claim 10, wherein determining a location of a sense line that is coupled to a memory cell in the group of memory cells that stores the target data value further comprises:
    comparing the data stored in the group of memory cells coupled to the destination access line to data stored in a group of the memory cells coupled to another access line to provide output data, wherein the other access line corresponds to a lower index of the vectors than the particular access line.

12. The method of claim 11, wherein determining a location of a sense line that is coupled to a memory cell in the group of memory cells that stores the target data value further comprises:
    performing an operation with the sensing circuitry to determine if the output data includes the target data value; and
    if the output data includes the target data value, determining a location of a sense line that is coupled to a memory cell in the group of memory cells coupled to the other access line that stores the target data value.

13. The method of claim 12, wherein determining a location of a sense line that is coupled to a memory cell in the group of memory cells coupled to the particular access line that stores the target data value further comprises:
    comparing the data stored in the group of memory cells coupled to the destination access line to data stored in a group of the memory cells coupled to a next-most significant access line to provide additional output data, wherein the next-most significant access line corresponds to a lower index of the vectors than the other access line;
    performing an operation with the sensing circuitry to determine if the additional output data includes the target data value; and
    if the additional output data includes the target data value, determining a location of a sense line that is coupled to a memory cell in the group of memory cells coupled to the next-most significant access line that stores the target data value.

14. The method of claim 13, further comprising repeating the comparison and the determination whether the additional output data includes the target data value for each access line corresponding to a lower index of the vectors than the next-most significant access line and, if the respective output data includes the target data value, determining a location of a sense line that is coupled to a memory cell in the group of memory cells coupled to the respective access line that stores the target data value.

15. The method of claim 10, further comprising storing a bit mask in the group of memory cells coupled to the destination access line prior to sensing the data stored in the group of memory cells coupled to the particular access line.

16. The method of claim 15, wherein the bit mask comprises the data stored in the group of memory cells coupled to the particular access line.

17. The method of claim 11, further comprising inverting data values stored in a number of accumulators associated with the group of memory cells prior to sensing the data stored in the group of memory cells coupled to the particular access line.

18. The method of claim 17, further comprising clearing out data values previously stored in the number of accumulators by storing default data values prior to inverting the default data values stored in the number of accumulators.

19. The method of claim 17, further comprising a second inversion of the data values stored in the number of accumulators that correspond to data stored in the group of memory cells coupled to the particular access line values stored in the number of accumulators after sensing the data stored in the group of memory cells coupled to the particular access line and before performing the operation with the sensing circuitry to determine if the sensed data includes the target data value.

20. The method of claim 19, further comprising inverting the data stored in the other access line corresponding to a next-lower index of the vector prior to comparing the data stored in the group of memory cells coupled to the destination access line to the data stored in the group of memory cells coupled to the other access line to provide the output data.

21. The method of claim 9, wherein performing an operation with the sensing circuitry to determine if the sensed data includes a target data value comprises performing a BlockOR operation with the sensing circuitry.

22. The method of claim 21, wherein performing a BlockOr operation with an accumulator of the sensing circuitry comprises:
charging an I/O line to a level corresponding to the target data value;
transferring the sensed data from a plurality of sense amplifiers to the I/O line; and
determining whether the level of the I/O line changes responsive to transferring the sensed data.

23. The method of claim 22, wherein determining whether the level of the I/O line changes responsive to transferring the sensed data comprises detecting, with a secondary sense amplifier, whether the level changes by at least a threshold amount, wherein the level of the I/O line changing by more than the threshold amount indicates that the sensed data stores the target data value.

24. The method of claim 9, wherein the extremum comprises a maximum and the target data value comprises a binary 1.

25. The method of claim 9, wherein the extremum comprises a minimum and the target data value comprises a binary 0.

26. The method of claim 9, wherein the extremum comprises a plurality of extremums and wherein determining a location of a sense line that is coupled to a memory cell in the group of memory cells that stores the target data value comprises determining locations of a plurality of sense lines that are coupled to memory cells in the group of memory cells that store the target data value.

27. The method of claim 9, wherein the group of memory cells comprises a row of the array of memory cells, wherein each of the vectors is stored in a respective column of the array of memory cells, and wherein each memory cell in the row is coupled to a respective sense line of a plurality of sense lines.

28. The method of claim 9, further comprising, if the sensed data does not includes the target data value:
sensing, with the sensing circuitry coupled to the array of memory cells, data stored in a group of the memory cells coupled to another access line, wherein the other access line corresponds to a lower index of the vectors than the particular access line;
performing an operation with the sensing circuitry to determine if the data sensed from the group of memory cells coupled to the other access line includes the target data value; and
if the data sensed from the group of memory cells coupled to the other access line includes the target data value, determining a location of a sense line that is coupled to a memory cell in the group of memory cells coupled to the other access line that stores the target data value.

29. The method of claim 9, further comprising reading data stored in memory cells coupled to the sense line to determine a value of the extremum.

30. The method of claim 9, wherein sensing, with sensing circuitry coupled to the array of memory cells, data stored in a group of the memory cells coupled to a particular access line comprises reading a row of memory cells of the array of memory cells.

31. An apparatus, comprising:
an array of memory cells storing numerical values as bit-vectors along sense lines; and
control circuitry coupled to the array and configured to control:
sensing, with sensing circuitry coupled to the array of memory cells, data stored in a group of the memory cells coupled to a particular access line;
performing an operation with the sensing circuitry to determine if the sensed data includes a target data value; and
responsive to the sensed data including the target data value, determining a location of a sense line that is coupled to a memory cell in the group of memory cells that stores the target data value.

32. The apparatus of claim 31, wherein the control circuitry is further configured to control:
storing the sensed data in a group of the memory cells coupled to a destination access line; and
comparing the data stored in the group of memory cells coupled to the destination access line to data stored in a group of the memory cells coupled to another access line to provide output data, wherein the other access line corresponds to a lower index of the bit-vectors than the particular access line.

33. The apparatus of claim 32, wherein the control circuitry is further configured to control:
performing an operation with the sensing circuitry to determine if the output data includes the target data value; and
if the output data includes the target data value, determining a location of a sense line that is coupled to a memory cell in the group of memory cells coupled to the other access line that stores the target data value.

34. The apparatus of claim 33, wherein the control circuitry is further configured to control determining a location of a sense line that is coupled to a memory cell in the group of memory cells coupled to the particular access line that stores the target data value by:
comparing the data stored in the group of memory cells coupled to the destination access line to data stored in a group of the memory cells coupled to a next-most significant access line to provide additional output data, wherein the next-most significant access line corresponds to a lower index of the vectors than the other access line;
performing an operation with the sensing circuitry to determine if the additional output data includes the target data value; and
if the additional output data includes the target data value, determining a location of a sense line that is coupled to a memory cell in the group of memory cells coupled to the next-most significant access line that stores the target data value.

35. The apparatus of claim 34, wherein the control circuitry is further configured to control:
repeating the comparison and the determination whether the additional output data includes the target data value for each access line corresponding to a lower index of the vectors than the next-most significant access line; and
if the respective output data includes the target data value, determining a location of a sense line that is coupled to a memory cell in the group of memory cells coupled to the respective access line that stores the target data value.

36. The apparatus of claim 32, wherein the control circuitry is further configured to control storing of a bit mask in the group of memory cells coupled to the destination access line prior to sensing the data stored in the group of memory cells coupled to the particular access line.

37. The apparatus of claim 36, wherein the bit mask comprises the data stored in the group of memory cells coupled to the particular access line.

38. The apparatus of claim 32, wherein the control circuitry is further configured to control inverting data values stored in a number of accumulators associated with the group of memory cells prior to sensing the data stored in the group of memory cells coupled to the particular access line.

39. The apparatus of claim 38, wherein the control circuitry is further configured to control clearing out data values previously stored in the number of accumulators by storing default data values prior to inverting the default data values stored in the number of accumulators.

40. The apparatus of claim 38, wherein the control circuitry is further configured to control performing a second inversion of the data values stored in the number of accumulators that correspond to data stored in the group of memory cells coupled to the particular access line values stored in the number of accumulators after sensing the data stored in the group of memory cells coupled to the particular access line and before performing the operation with the sensing circuitry to determine if the sensed data includes the target data value.

41. The apparatus of claim 40, wherein the control circuitry is further configured to control inverting the data stored in the other access line corresponding to a next-lower index of the vector prior to comparing the data stored in the group of memory cells coupled to the destination access line to the data stored in the group of memory cells coupled to the other access line to provide the output data.

42. The apparatus of claim 31, wherein the control circuitry is further configured to controlperforming a BlockOR operation with the sensing circuitry to determine if the sensed data includes the target data value.

43. The apparatus of claim 42, wherein the control circuitry is further configured to control performing a BlockOr operation with an accumulator of the sensing circuitry by:
charging an I/O line to a level corresponding to the target data value;
transferring the sensed data from a plurality of accumulators to the I/O line; and
determining whether the level of the I/O line changes responsive to transferring the sensed data.

44. The apparatus of claim 43, wherein the control circuitry is configured to control detecting, with a secondary sense amplifier, whether the level changes by at least a threshold amount, wherein the level of the I/O line changing by less than the threshold amount indicates that the sensed data stores the target data value to determine whether the level of the I/O line changes responsive to transferring the sensed data comprises.

45. The apparatus of claim 31, wherein control circuitry is further configured to control:
determining a plurality of extremums; and
determining locations of a plurality of sense lines that are coupled to memory cells in the group of memory cells that store the target data value and correspond respectively to each of the plurality of extremums.

46. The apparatus of claim 31, wherein the group of memory cells comprises a row of the array of memory cells, wherein each of the vectors is stored in a respective column of the array of memory cells, and wherein each memory cell in the row is coupled to a respective sense line of a plurality of sense lines.

47. The apparatus of claim 31, wherein, if the sensed data does not include the target data value, the control circuitry is further configured to control:
sensing, with the sensing circuitry coupled to the array of memory cells, data stored in a group of the memory cells coupled to another access line, wherein the other access line corresponds to a lower index of the vectors than the particular access line;
performing an operation with the sensing circuitry to determine if the data sensed from the group of memory cells coupled to the other access line includes the target data value; and
if the data sensed from the group of memory cells coupled to the other access line includes the target data value, determining a location of a sense line that is coupled to a memory cell in the group of memory cells coupled to the other access line that stores the target data value.

48. The apparatus of claim 31, wherein the control circuitry is further configured to control reading data stored in memory cells coupled to the sense line to determine a value of the extremum.

49. An apparatus comprising:
an array of memory cells storing numerical values as bit-vectors along sense lines;
control circuitry coupled to the array and configured to cause:
a determination whether a first number of memory cells coupled to a first access line stores a data value;
a comparison of values in each of the first number of memory cells storing most-significant bit data and coupled to the first access line with corresponding values in each of a second number of memory cells storing second-most-significant bit-data and coupled to a second access line using an AND operation;

values obtained from the AND operation to be written to a bit-mask in the array;

a repetition of a number of comparisons using a number of AND operations of a number of memory cells storing next-most-significant data values and coupled to a first corresponding access line with memory cells storing prior-most-significant data values and coupled to a second corresponding access line until there are no memory cells coupled to any of the access lines that store the data value;

a determination of which memory cells coupled to a sense line in the array store an extremum value based on the comparisons; and an identification of the extremum value of the array by reading the determined memory cells coupled to the corresponding sense line; and sensing circuitry coupled to the array and configured to:
sense the number of memory cells storing most-significant data values coupled to the first corresponding access line, the number of memory cells storing second-most-significant data values coupled to the second corresponding access line, and a number of memory cells storing data values of subsequently decreasing significance and coupled to additional corresponding access lines.

50. The apparatus of claim 49, wherein the repetition of the number of comparisons comprises a comparison of data values stored in the bit-mask with a third number of memory cells storing third-most-significant data values and coupled to a third access line.

51. The apparatus of claim 49, wherein the determination whether the first number of memory cells includes the data value is performed by:
control circuitry coupled to the memory array and configured to cause a charging of an input/output (TO) line of the memory array to a voltage; and
sensing circuitry coupled to the memory array and comprising:
a number of primary sense amplifiers coupled to respective pairs of complementary sense lines;
a number of accumulators coupled to the number of primary sense amplifiers; and
a secondary sense amplifier coupled to the TO line and configured to sense whether the voltage of the TO line changes in response to activation of selected decode lines of the array to determine whether data stored in the array includes the data value.

52. The apparatus of claim 49, wherein the determination of which memory cell in the array includes the extremum value is identified as a location of a memory cell in the array that maintains a value in the bit-mask after other values stored in the bit mask have been dropped.

53. An apparatus comprising:
an array of memory cells storing N number of bit-vectors corresponding to numerical values along sense lines;
sensing circuitry coupled to the array and configured to:
sense a first number of memory cells coupled to an access line storing most-significant bit data to determine if there is a data value associated with an extremum value in memory cells of the first number of memory cells;
sense a second number of memory cells coupled to a second access line storing second-most-significant bit data;
compare data values stored in the first number of memory cells to data values stored in the corresponding second number of memory cells;
control circuitry coupled to the array and configured to control:
repeating the sensing and comparing of memory cells coupled to previous-most significant access lines and memory cells coupled to next-most significant access lines until a particular access line coupled to memory cells storing least-significant bit data corresponding to the bit-vectors has been sensed;
determining which sense lines are coupled to memory cells storing an extremum value based on a bit-mask stored in cells coupled to the destination access line; and
identifying extremum values by reading memory cells coupled to a sense line based on the bit-mask stored in the cells coupled to the destination access line.

54. The apparatus of claim 53, wherein the extremum values include one of maximum values and minimum values.

55. The apparatus of claim 53, wherein a number of repetitions to reach the particular access line coupled to memory cells storing the least-significant bit data is associated with a bit-length of the bit-vectors.

56. An apparatus comprising:
an array of memory cells storing N number of bit-vectors;
control circuitry coupled to the array and configured to control:
sensing a first number of memory cells coupled to an access line storing most-significant bit data to determine if there is a data value associated with an extremum value in memory cells of the first number of memory cells, wherein the determining includes:
precharging of a local input/ouput (LIO) line of the array to a precharge voltage; and
selective activation of the first number of memory cells; and
determining whether the precharge voltage of the LIO line changes in response to activation of the selectively activated first number of memory cells;
sensing a second number of memory cells coupled to a second access line storing second-most-significant bit data;
comparing data values stored in the first number of memory cells to data values stored in the corresponding second number of memory cells;
repeating the sensing and the comparing of memory cells coupled to previous-most significant access lines to memory cells coupled to next-most significant access lines until an access line coupled to memory cells storing least-significant bit data has been reached;
determining which sense line is coupled to memory cells storing an extremum value based on a bit-mask stored in a destination row;
identifying an extremum value by reading memory cells coupled to a sense line based on the bit-mask stored in the destination row.

57. The apparatus of claim 56, wherein the destination row indicates a plurality of sense lines coupled to memory cells storing the extremum value.

58. The apparatus of claim 57, wherein identifying an extremum value comprises identifying extremum values by reading memory cells coupled to a plurality of sense lines based on the bit-mask stored in the destination row.

* * * * *